United States Patent
Shen et al.

(10) Patent No.: US 9,348,161 B2
(45) Date of Patent: May 24, 2016

(54) ARRAY SUBSTRATE, LIQUID CRYSTAL DISPLAY PANEL AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Qiyu Shen, Beijing (CN); Xu Chen, Beijing (CN); Jian Guo, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 0 days.

(21) Appl. No.: 14/428,932

(22) PCT Filed: Jul. 10, 2014

(86) PCT No.: PCT/CN2014/081985
§ 371 (c)(1),
(2) Date: Mar. 17, 2015

(87) PCT Pub. No.: WO2015/103859
PCT Pub. Date: Jul. 16, 2015

(65) Prior Publication Data
US 2016/0041414 A1 Feb. 11, 2016

(30) Foreign Application Priority Data
Jan. 9, 2014 (CN) .......................... 2014 1 0010209

(51) Int. Cl.
*H01L 35/24* (2006.01)
*H01L 25/16* (2006.01)
(Continued)

(52) U.S. Cl.
CPC .......... *G02F 1/13318* (2013.01); *G02F 1/1313* (2013.01); *G02F 1/1368* (2013.01);
(Continued)

(58) Field of Classification Search
CPC ... H01L 27/12; H01L 25/167; G02F 1/13318;
G02F 1/1368; G02F 1/1313; G02F 1/13439;
G02F 1/134309; G02F 1/133555; G02F
2001/134345; G02F 2001/13324
USPC ........ 257/40, 59, 72, 290, 292, 432, E27.111,
257/E27.141, E29.005, E29.282, E33.007,
257/E51.001; 313/505, 506; 349/63, 116;
438/48, 57, 73, 164
See application file for complete search history.

(56) References Cited

U.S. PATENT DOCUMENTS 7,242,449 B1 * 7/2007 Yamazaki ............. G02F 1/1362
257/E27.111
7,994,461 B2 * 8/2011 Koshiba ............ H01L 27/14623
250/208.1
(Continued)

FOREIGN PATENT DOCUMENTS

CN 101828145 A 9/2010
CN 102751242 A 10/2012
(Continued)

OTHER PUBLICATIONS

Oct. 26, 2015—(CN)—First Office Action Appn 201410010209.6 and its English Tran.
(Continued)

*Primary Examiner* — Dao H Nguyen
(74) *Attorney, Agent, or Firm* — Banner & Witcoff, Ltd.

(57) ABSTRACT

An array substrate, a liquid crystal display panel and a display device are disclosed. The array substrate includes a base substrate, a plurality of pixel units disposed on the base substrate, a drive module providing each of the pixel units with a display signal; a photovoltaic battery component electrically connected to the drive module, which includes a plurality of photovoltaic sub-batteries, each of the photovoltaic sub-batteries including a first transparent electrode, a photovoltaic thin film and a second transparent electrode; the orthographic projection of the photovoltaic thin film on the base substrate lies within the light blocking region. Because the orthographic projection of the photovoltaic thin film on the base substrate lies within the light blocking region, aperture ratio of each pixel unit in the array substrate will not be affected.

20 Claims, 5 Drawing Sheets

(51) Int. Cl.
*H01L 27/00* (2006.01)
*G02F 1/1368* (2006.01)
*G02F 1/133* (2006.01)
*H01L 27/12* (2006.01)
*G02F 1/13* (2006.01)
*G02F 1/1335* (2006.01)
*G02F 1/1343* (2006.01)
*G02F 1/1333* (2006.01)

(52) U.S. Cl.
CPC ...... *G02F1/13439* (2013.01); *G02F 1/133555* (2013.01); *G02F 1/134309* (2013.01); *H01L 25/167* (2013.01); *H01L 27/12* (2013.01); *G02F 2001/13324* (2013.01); *G02F 2001/133357* (2013.01); *G02F 2001/134345* (2013.01)

(56) References Cited

U.S. PATENT DOCUMENTS

| 8,513,657 | B2* | 8/2013 | Suzuki | B82Y 10/00 257/40 |
| 8,809,924 | B2* | 8/2014 | Suzuki | H01L 27/1461 250/200 |
| 2008/0006828 | A1* | 1/2008 | Zhang | G02F 1/135 257/72 |
| 2009/0103165 | A1* | 4/2009 | Kothari | G02F 1/13306 359/290 |
| 2011/0249219 | A1* | 10/2011 | Evans | G02F 1/13306 349/63 |

FOREIGN PATENT DOCUMENTS

| CN | 103258841 A | 8/2013 |
| CN | 103760707 A | 4/2014 |

OTHER PUBLICATIONS

Oct. 8, 2014 (CN) International Search Report for PCT/CN2014/081985.

Oct. 8, 2014 (CN) Written Opinion for PCT/CN2014/081985—Eng Trans.

Mar. 14, 2016—(CN)—Second Office Action Appn 201410010209.6 with English Tran.

* cited by examiner

ARRAY SUBSTRATE, LIQUID CRYSTAL DISPLAY PANEL AND DISPLAY DEVICE

The application is a U.S. National Phase Entry of International Application No. PCT/CN2014/081985 filed on Jul. 10, 2014, designating the United States of America and claiming priority to Chinese Patent Application No. 201410010209.6 filed on Jan. 9, 2014. The present application claims priority to and the benefit of the above-identified applications and the above-identified applications are incorporated by reference herein in their entirety.

TECHNICAL FIELD

Embodiments of the present invention relate to an array substrate, a liquid crystal display panel, and a display device.

BACKGROUND

Thin Film Transistor-Liquid Crystal Displays (TFT-LCDs) have played a leading role in the current market for display panels by virtue of the advantages of small volume, low power consumption, irradiation-free and so on. A thin film transistor-liquid crystal display panel is mainly composed of an array substrate, a counter substrate, liquid crystal molecules located between the two substrates and a backlight source. A plurality of pixel units arranged in the form of a matrix are disposed in the array substrate, and a thin film transistor, a metal signal line and a pixel electrode are provided in each pixel unit. In each pixel unit, generally, a region through which light in the backlight source is transmissible is called as a transmissive region, and a region through which light in the backlight source is not transmissible is called as a light blocking region. In the thin film transistor-liquid crystal display panel, the light blocking region of the pixel unit usually corresponds to the region where the thin film transistor and the metal signal line are located, and the transmissive region of the pixel unit usually corresponds to the region where the pixel electrode is located.

At present, an existing liquid crystal display panel merely uses the optical energy transmitted by the transmissive region, while the optical energy blocked by the light blocking region is in a wasteful condition. Therefore, the utilization rate of optical energy of an existing liquid crystal display panel is relatively low.

SUMMARY

An array substrate provided by an embodiment of the invention includes a base substrate, a plurality of pixel units disposed on the base substrate and arranged in a form of matrix, and a drive module providing each of the pixel units with a display signal; each of the pixel units being divided into a transmissive region and a light blocking region, wherein, the array substrate further includes:

a photovoltaic battery component electrically connected to the drive module, which is disposed between the base substrate and the pixel units, or disposed on a side of the base substrate facing away from the pixel units;

the photovoltaic battery component includes a plurality of photovoltaic sub-batteries, each of which includes a first transparent electrode, a photovoltaic thin film and a second transparent electrode laminated in sequence; wherein, an orthographic projection of the photovoltaic thin film on the base substrate lies within the light blocking region.

With respect to the above array substrate provided by embodiments of the invention, due to provision of the photovoltaic battery component electrically connected to the drive module, the array substrate can use the photovoltaic battery component to transform the optical energy of the light blocking region into electrical energy, and to output the electrical energy to the drive module for its use. Thus, the optical energy of the light blocking region can be utilized effectively, and utilization rate of the optical energy of the array substrate is raised. Furthermore, the orthographic projection of the opaque photovoltaic thin film in the photovoltaic battery component on the base substrate lies within the light blocking region, and therefore, aperture ratio of each pixel unit in the array substrate will not be affected.

In order to utilize the optical energy of the light blocking region effectively, the above array substrate provided by embodiments of the invention further includes:

a metal reflective layer located between the pixel units and the photovoltaic battery component;

the orthographic projection of the photovoltaic thin film on the base substrate falls within an orthographic projection of the metal reflective layer on the base substrate, and the orthographic projection of the metal reflective layer on the base substrate lies within the light blocking region.

In an example, the pixel units and the photovoltaic battery component are located on a same side of the base substrate, and the metal reflective layer is located directly on the second transparent electrode, and patterns of the second transparent electrode and the metal reflective layer are coincide. As such, the second transparent electrode and the metal reflective layer may be formed by one patterning process, so as to simplify the producing process.

In an example, the pixel units and the photovoltaic battery component are located on two sides of the base substrate, respectively, the metal reflective layer is located directly on the first transparent electrode, and patterns of the first transparent electrode and the metal reflective layer are coincide. As such, the first transparent electrode and the metal reflective layer may be formed by one patterning process, so as to simplify the producing process.

In an example, in order to prevent a step from happening to a pixel unit during manufacture, in the above array substrate provided by embodiments of the invention, the pixel units and the photovoltaic battery component are located on the same side of the base substrate, and it further includes:

a planarizing layer located between the photovoltaic battery component and the pixel units.

In an example, in order that electrical energy transformed by the photovoltaic battery component can be transmitted to the drive module stably, in the above array substrate provided by embodiments of the invention, there is further included a voltage-stabilizing and current-stabilizing module, through which the photovoltaic battery component is electrically connected to the drive module.

In an example, in order to raise the voltage of electric energy output by the photovoltaic battery component, in the above array substrate provided by embodiments of the invention, a plurality of the photovoltaic sub-batteries are connected in series or in parallel to each other.

In an example, for the sake of facilitating implementation, the photovoltaic thin film includes an amorphous silicon thin film and a microcrystalline silicon thin film which are laminated.

In an example, the light blocking region is a region where a thin film transistor and a metal signal line of the array substrate are located.

In an example, a pixel for display of the pixel unit includes a transmissive sub-pixel and a reflective sub-pixel, and the light blocking region further includes a region where the reflective sub-pixel is located.

A liquid crystal display panel provided by an embodiment of the invention, includes any of the above array substrates provided by embodiments of the invention.

A display device provided by an embodiment of the invention, includes the above liquid crystal display panel provided by embodiment of the invention.

BRIEF DESCRIPTION OF THE DRAWINGS

In order to illustrate the technical solution of the embodiments of the invention more clearly, the drawings of the embodiments will be briefly described below; it is obvious that the drawings as described below are only related to some embodiments of the invention, but not limitative of the invention.

DETAILED DESCRIPTION

In order to make objects, technical details and advantages of the embodiments of the invention apparent, hereinafter, the technical solutions of the embodiments of the invention will be described in a clearly and fully understandable way in connection with the drawings related to the embodiments of the invention. It is obvious that the described embodiments are just a part but not all of the embodiments of the invention. Based on the described embodiments of the invention, those ordinarily skilled in the art can obtain other embodiment(s), without any inventive work, which should be within the scope sought for protection by the invention.

The size and shape of components in drawings do not reflect the true scale of an array substrate, and they are merely intended to exemplarily illustrate contents of the invention.

Figure 1A:
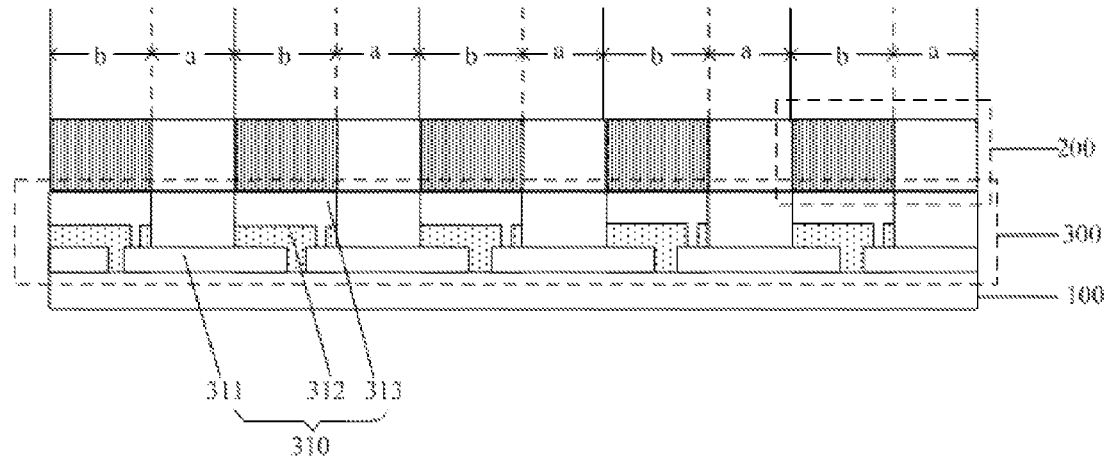
FIG. 1a and FIG. 1b are structurally schematic views respectively illustrating an array substrate provided by an embodiment of the invention.
Figure 1B:
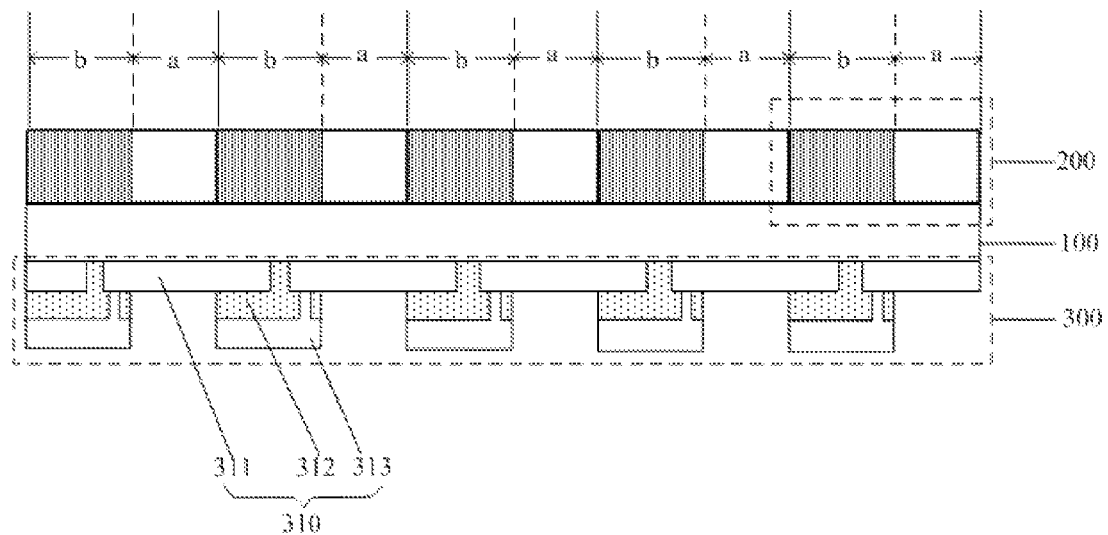

An array substrate provided by an embodiment of the invention, as illustrated in FIG. 1a and FIG. 1b, includes a base substrate 100, a plurality of pixel units 200 disposed on the base substrate 100 and arranged in the form of a matrix, and a drive module (whose structure is not illustrated in FIG. 1a and FIG. 1b) for providing each pixel unit 200 with a display signal; each of the pixel units 200 is divided into a transmissive region a and a light blocking region b. The array substrate further includes:

a photovoltaic battery component 300 electrically connected to the drive module. The photovoltaic battery component 300, as illustrated in FIG. 1a, is disposed between the base substrate 100 and the pixel units 200, or as illustrated in FIG. 1b, is disposed on a side of the base substrate 100 facing away from the pixel units 200.

The photovoltaic battery component 300 includes a plurality of photovoltaic sub-batteries 310, and each of the photovoltaic sub-batteries 310 includes a first transparent electrode 311, a photovoltaic thin film 312 and a second transparent electrode 313 that are laminated in sequence.

The orthographic projection of a photovoltaic thin film 312 on the base substrate 100 lies within a light blocking region b.

With respect to the above array substrate provided by embodiments of the invention, due to provision of the photovoltaic battery component electrically connected to the drive module, the array substrate can utilize the photovoltaic battery component to transform optical energy of a light blocking region into an electrical energy, and to output the electrical energy to the drive module for its use. Thus, the optical energy of a light blocking region can be used effectively, and the utilization rate of optical energy of the array substrate is enhanced. Furthermore, the orthographic projection of a light-proof photovoltaic thin film in the photovoltaic battery component on the base substrate lies within a light blocking region, and so, the aperture ratio of each pixel unit in the array substrate will not affected.

It is to be noted that, the photovoltaic thin film in the photovoltaic battery component provided by embodiments of the invention may be a single junction amorphous silicon thin film, a double junction amorphous silicon thin film, a double junction microcrystalline silicon thin film, or a multi junction laminated thin film, or, it may also be a monocrystalline silicon thin film, a polycrystalline silicon thin film or the like. Certainly, as long as it is a photovoltaic thin film usable for implementing the scheme of the invention, it falls within the protective scope of the invention.

Figure 5A:
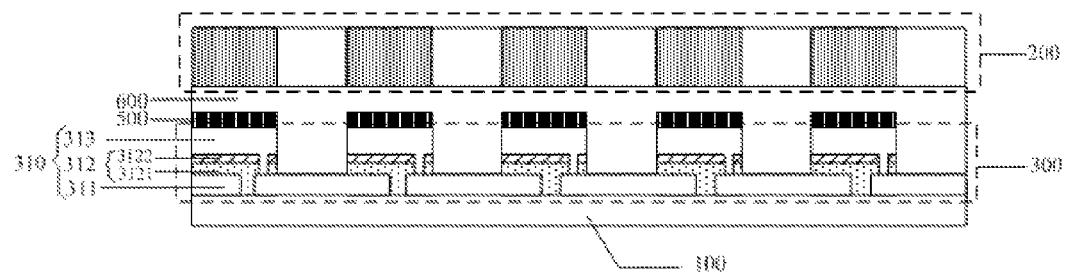
FIG. 5a and FIG. 5b are structurally schematic views respectively illustrating an array substrate provided with a metal reflective layer provided by an embodiment of the invention.
Figure 5B:
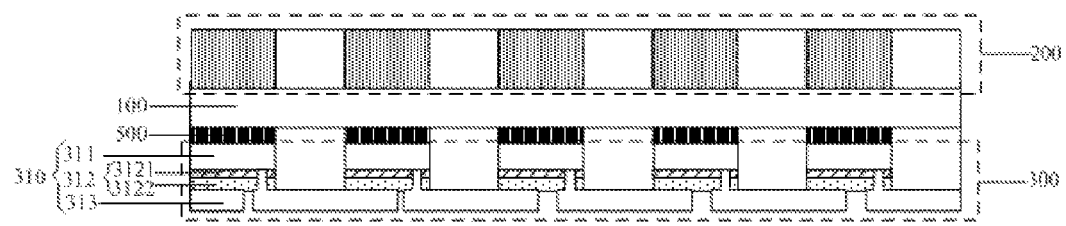

For example, in the above array substrate provided by embodiments of the invention, as illustrated in FIG. 5a and FIG. 5b, the photovoltaic thin film 312 may include an amorphous silicon thin film 3121 and a microcrystalline silicon thin film 3122 that are laminated, and no limit will be set here.

Further, upon concrete implementation, in the above array substrate provided by embodiments of the invention, thickness of the amorphous silicon thin film is controlled, such as in the range of 200 nm to 300 nm, and thickness of the microcrystalline silicon thin film is controlled, such as in the range of 1 μm to 3 μm. No limit will be set here.

Further, in the above array substrate provided by embodiments of the invention, material for the first transparent electrode and the second transparent electrode may be a transparent conductive oxide (TCO) material. Of course, it may also be other material usable for implementing the scheme of the present invention, and no limit will be set here.

Further, in the above array substrate provided by embodiments of the invention, as illustrated in FIG. 1a and FIG. 1b, the first transparent electrode 311 is close to the base substrate 100, and the second transparent electrode 313 is far away from the base substrate 100. Upon concrete implementation, thickness of the first transparent electrode 311 is controlled, such as in the range of 1500 nm to 1800 nm, and thickness of the second transparent electrode 313 is controlled, such as to be 100 nm or so.

Figure 2A:
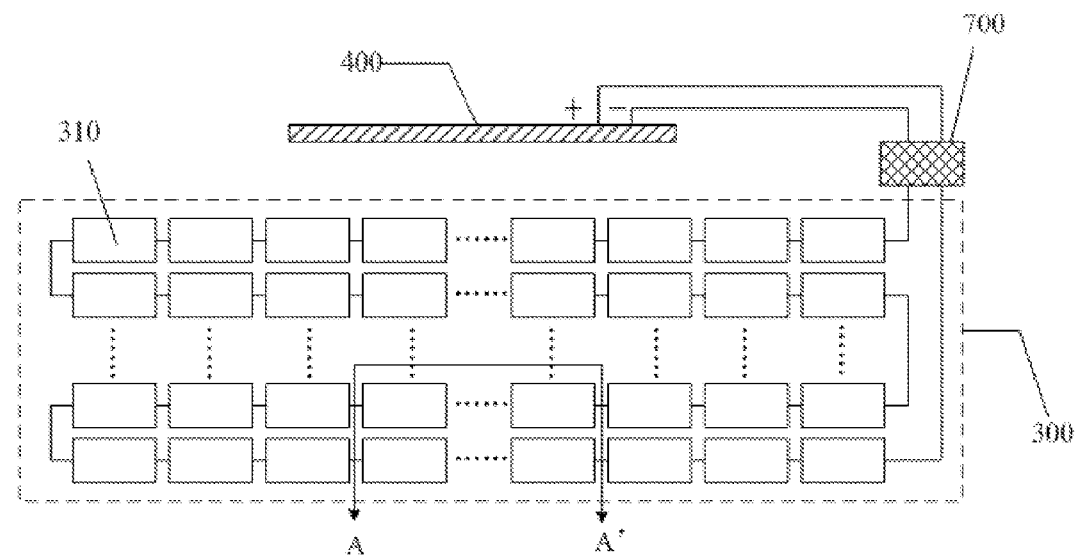
FIG. 2a and FIG. 2b are schematic views respectively illustrating connection between a photovoltaic battery component and a drive module provided by an embodiment of the invention.
Figure 2B:
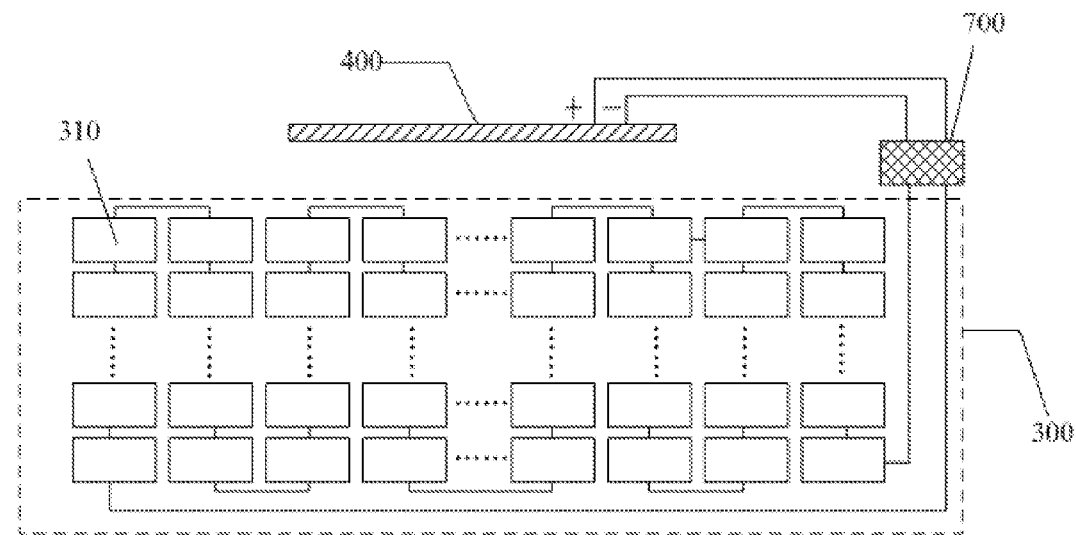

In order to raise voltage of the electrical energy output from the photovoltaic battery component, in the above array substrate provided by embodiments of the invention, as illustrated in FIG. 2a and FIG. 2b, the photovoltaic battery component 300 may be a serial structure, that is, a plurality of photovoltaic sub-batteries 310 are connected in series to each other. FIG. 2a and FIG. 2b are planar-structurally schematic views respectively illustrating the electrical connection between a photovoltaic battery component 300 and a drive module 400.

In the above array substrate provided by embodiments of the invention, for example, adjacent photovoltaic sub-batteries 310 are connected to each other. Upon concrete implementation, as illustrated in FIG. 2a, connection between adjacent photovoltaic sub-batteries 310 may be the case where adjacent photovoltaic sub-batteries 310 in the same row are connected, and series connection between photovoltaic sub-batteries 310 in two adjacent rows is realized by connecting two photovoltaic sub-batteries 310 located at the same end of the two adjacent rows. Certainly, as illustrated in FIG. 2b, connection between adjacent photovoltaic sub-batteries 310 may be the case where adjacent photovoltaic sub-batteries 310 in the same column are connected, and series connection between photovoltaic sub-batteries 310 in two adjacent columns is realized by connecting two photovoltaic sub-batteries 310 located at the same end of the two adjacent columns. Of course, photovoltaic sub-batteries 310 may also be connected in series by other connecting way, and no limit will be set here.

Figure 3:
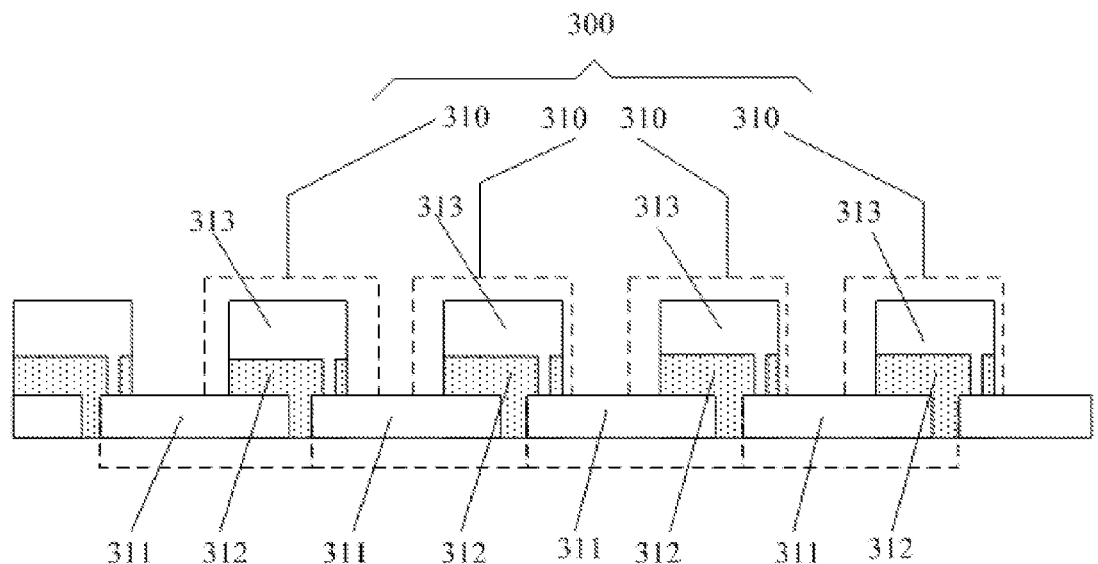
FIG. 3 is a schematic view illustrating a section of the photovoltaic battery component in FIG. 2a taken in the direction of A-A'.

Further, in the above array substrate provided by embodiments of the invention, as illustrated in FIG. 3, among the series-connected photovoltaic sub-batteries 310, in the same photovoltaic sub-battery 310, the short-circuiting phenomenon does not exist between the first transparent electrode 311 and the second transparent electrode 313, and it exists neither between first transparent electrodes 311 in adjacent photovoltaic sub-batteries 310, nor between second transparent electrodes 313 in adjacent photovoltaic sub-batteries 310.

In the above array substrate provided by embodiments of the invention, a section of series connection between two adjacent photovoltaic sub-batteries 310 is illustrated in FIG. 3, and FIG. 3 is a section taken along the direction of A-A' in FIG. 2a. In two adjacent photovoltaic sub-batteries 310, a first transparent electrode of one of the photovoltaic sub-batteries 310 is electrically connected to a second transparent electrode 313 of the other of the photovoltaic sub-batteries 310 through a via hole penetrating a photovoltaic thin film 312 of the photovoltaic sub-battery 310, so as to achieve the series connection between two adjacent photovoltaic sub-batteries 310.

Figure 4:
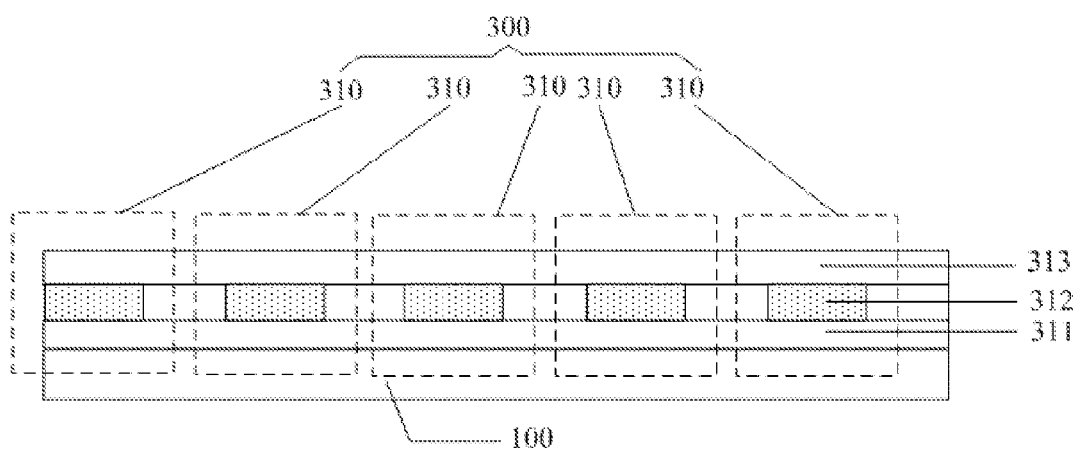
FIG. 4 is a structurally schematic view illustrating a photovoltaic battery component provided by an embodiment of the invention.

Certainly, in the above array substrate provided by embodiments of the invention, in order to simplify the manufacturing process, photovoltaic battery component 300 may also be a parallel structure, namely, a plurality of the photovoltaic sub-batteries 310 may be connected in parallel to each other. As illustrated in FIG. 4, a first transparent electrode 311 of every photovoltaic sub-battery 310 is connected directly, that is, a thin film for the first transparent electrode covers the whole base substrate directly, and there is no need to form separate pattern for each first transparent electrode 311, so as to simplify the manufacturing process. Likewise, a second transparent electrode 313 of every photovoltaic sub-battery is connected directly, that is, a thin film for the second transparent electrode covers the whole base substrate directly, and there is no need to form separate pattern for each second transparent electrode 313. However, the voltage value output by the photovoltaic battery component 300 having a parallel structure is relatively low.

In order to utilize the optical energy of a light blocking region effectively, the above array substrate provided by embodiments of the invention, as illustrated in FIG. 5a and FIG. 5b, further includes:

a metal reflective layer 500 located between the pixel units 200 and the photovoltaic battery component 300.

The orthographic projection of the metal reflective layer 500 on a base substrate 100 covers the orthographic projection of a photovoltaic thin film 312 on the base substrate, and lies within a light blocking region. That is, the orthographic projection of the photovoltaic thin film on the base substrate falls within the orthographic projection of the metal reflective layer on the base substrate, and the orthographic projection of the metal reflective layer on the base substrate lies within the light blocking region. Of course, upon concrete implementation, it may also be unnecessary to provide a metal reflective layer separately, and the effect of providing a metal reflective layer is achieved by directly using the metal reflective action of an opaque metal signal line in a light blocking region of a pixel unit or a gate electrode of a thin film transistor. But by doing so, utilization ratio of optical energy is lower than the utilization ratio of optical energy for an array substrate provided with a metal reflective layer separately.

In the above array substrate provided by embodiments of the invention, as illustrated in FIG. 5a, when pixel units 200 and a photovoltaic battery component 300 are located on the same side of a base substrate 100, a metal reflective layer 500 is located between the pixel units 200 and the photovoltaic battery component 300. When pixel units 200 and a photovoltaic battery component 300 are located on both sides of a base substrate 100, respectively, as illustrated in FIG. 5b, a metal reflective layer 500 may be located between the base substrate 100 and the photovoltaic battery component 400, or, a metal reflective layer 500 may also be located between the base substrate 100 and the pixel units 200.

In the above array substrate provided by embodiments of the invention, as illustrated in FIG. 5a, pixel units 200 and the photovoltaic battery component 300 are located on the same side of the base substrate 100, the metal reflective layer 500 may be located on a second transparent electrode 313 directly, and patterns of the second transparent electrode 313 and the metal reflective layer 500 may be set to be coincide. As such, upon manufacture, the second transparent electrode 313 and the metal reflective layer 500 may be formed by one patterning process, so that the producing process can be simplified.

Alternatively, in the above array substrate provided by embodiments of the invention, as illustrated in FIG. 5b, pixel units 200 and the photovoltaic battery component 300 are located on both sides of a base substrate 100, respectively, the metal reflective layer 500 may be located on the first transparent electrode 311 directly, and patterns of the first transparent electrode 311 and the metal reflective layer 500 may be set to be coincide. As such, upon manufacture, the first transparent electrode 311 and the metal reflective layer 500 may be formed by one patterning process, so that the producing process can be simplified.

Further, upon concrete implementation, in the above array substrate provided by embodiments of the invention, material of the metal reflective layer is preferably aluminum or silver. Of course, material of the metal reflective layer may also be other material usable for implementing the scheme of the invention, and no limit will be set here.

In the above array substrate provided by embodiments of the invention, as illustrated in FIG. 5a, pixel units 200 and the photovoltaic battery component 300 are located on the same side of the base substrate 100, and in order to avoid a step resulting from inconsistent surface height of the photovoltaic battery component during manufacture, it further includes:

a planarizing layer 600 located between the photovoltaic battery component 300 and the pixel units 200.

In the above array substrate provided by embodiments of the invention, the planarizing layer may include a silicon nitride thin film, a resin thin film and a silicon nitride thin film laminated in sequence; or, the planarizing layer may also include a silicon dioxide thin film, a resin thin film and a silicon dioxide thin film laminated in sequence. For example, the resin thin film is made by a resin material resistant to high temperature, and no limit will be set here.

In the above array substrate provided by embodiments of the invention, when pixel units and a photovoltaic battery component are located on two sides of a base substrate, respectively, in order to protect the photovoltaic battery component, it is also required that a transparent protective layer is disposed at the outmost side of the photovoltaic battery component facing away from the base substrate. No limit will be set here.

In order that an electrical energy transformed by the photovoltaic battery component can be transmitted to the drive module stably, in the above array substrate provided by embodiments of the invention, as illustrated in FIG. 2a and FIG. 2b, it further includes a voltage-stabilizing and current-stabilizing module 700, through which the photovoltaic battery component 300 is electrically connected to the drive module 400.

Hereinafter, a manufacturing method of the above array substrate will be described with the array substrate illustrated in FIG. 5a as an example.

For manufacture of the array substrate illustrated in FIG. 5a, a specific manufacturing process includes the following steps.

Figure 6A:
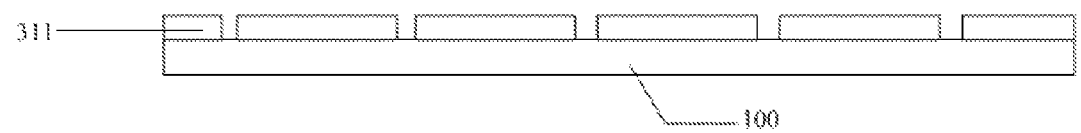
FIG. 6a to FIG. 6d are structurally schematic views after execution of each step for a manufacturing method of an array substrate provided by an embodiment of the invention, respectively.

(1) Pattern of a first transparent electrode 311 is formed on a base substrate 100, as illustrated in FIG. 6a;

Upon concrete implementation, firstly, a first transparent conductive oxide thin film TCO is deposited on a base substrate by way of pulsed laser deposition, metal organic chemical vapor deposition, radio frequency/immediate frequency/direct current sputtering, electron beam and thermal reactive evaporation, spray pyrolysis, sol-gel method, plasma chemical vapor deposition, or the like. Thickness of the first transparent conductive oxide thin film is controlled, such as, in the range of 1500 nm to 1800 nm.

Next, a wet etching treatment is conducted on a surface of the first transparent conductive oxide thin film by $CH_3COOH$, so that the surface of the first transparent conductive oxide thin film has a textured structure. Specifically, concentration of $CH_3COOH$ is controlled to be about 0.5%, and time of the wet etching treatment is controlled, such as, in the range of 20 minutes to 30 minutes.

Finally, pattern of the first transparent electrode is formed in the first transparent conductive oxide thin film with the textured structure by way of laser cutting or wet etching.

Figure 6B:
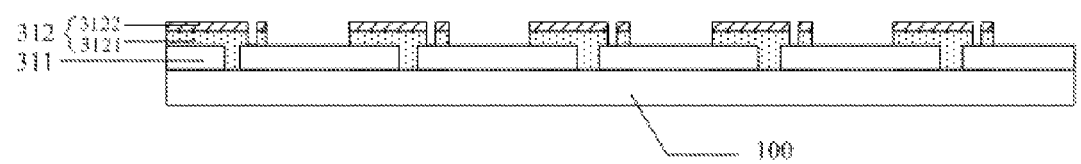

(2) Pattern of a photovoltaic thin film 312 is formed on the first transparent electrode 311, as illustrated in FIG. 6b.

Upon concrete implementation, firstly, an amorphous silicon thin film and a microcrystalline silicon thin film are deposited sequentially on the first transparent electrode by a chemical vapor deposition method. Thickness of the amorphous silicon thin film is controlled, such as, in the range of 200 nm to 300 nm, and thickness of the microcrystalline silicon thin film is controlled, such as, in the range of 1 μm to 3 μm.

After that, pattern of the photovoltaic thin film is formed in the amorphous silicon thin film and the microcrystalline silicon thin film by way of laser cutting or dry etching.

Figure 6C:
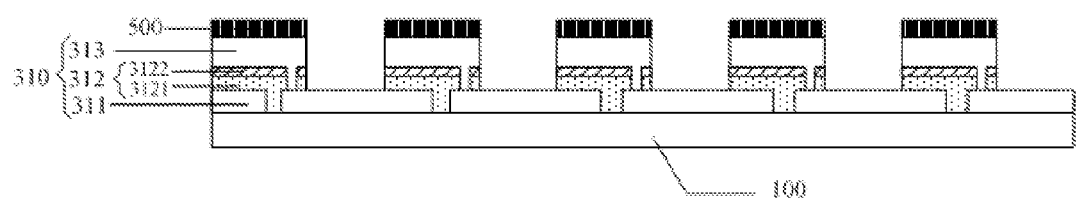

(3) Patterns of a second transparent electrode 313 and a metal reflective layer 500 are formed on the photovoltaic thin film 312 simultaneously by one patterning process, as illustrated in FIG. 6c.

Upon concrete implementation, firstly, a second transparent conductive oxide thin film TCO is deposited on a microcrystalline silicon thin film 3122; and thickness of the second transparent conductive oxide thin film is controlled, such as, to be about 100 nm.

Next, a reflective metal thin film is deposited on the second transparent conductive oxide thin film by a physical vapor deposition method; and material of the reflective metal thin film is such as silver or aluminum.

Finally, patterns of the second transparent electrode and the metal reflective layer are formed in the second transparent conductive oxide thin film and the reflective metal thin film by one patterning process; and the patterning process may be laser cutting or wet etching.

Figure 6D:
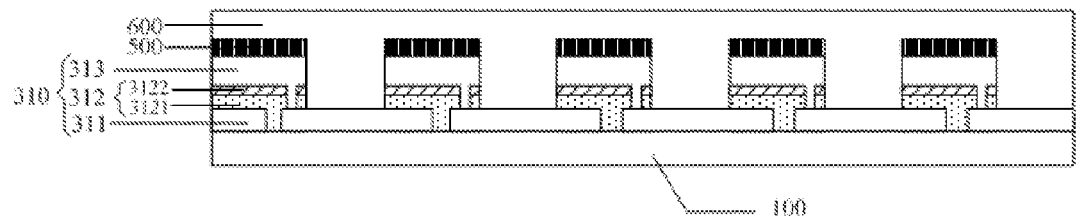

(4) A planarizing layer 600 is deposited on the metal reflective layer 500, as illustrated in FIG. 6d.

Upon concrete implementation, material of the planarizing layer is preferably silicon nitride (SiNx)/resin material (Resin)/silicon nitride (SiNx), or silicon dioxide ($SiO_2$)/resin material (Resin)/silicon dioxide ($SiO_2$), wherein, the resin material adopts a resin material resistant to high temperature; further, a thin film of silicon nitride or silicon dioxide may be deposited by way of chemical vapor deposition, and the resin material may be fabricated by using a spin-coating process.

(5) Pattern of pixel units 200 are formed on the planarizing layer 600, as illustrated in FIG. 5a.

Production of pattern of the pixel units is consistent with that in prior art, and details will be omitted here. Specifically, after going through the above steps (1) to (5), the array substrate illustrated in FIG. 5a according to an embodiment of the invention is attained.

It is to be noted that, the above array substrate provided by embodiments of the invention may be applied to a liquid crystal display panel, and may also be applied to an organic electroluminescent display device. No limit will be set here.

When the above array substrate provided by embodiments of the invention is applied to a liquid crystal display panel, in the above array substrate provided by embodiments of the invention, a pixel unit includes a thin film transistor and a metal signal line located within a light blocking region, and a pixel electrode located within a transmissive region. Specifically, the pixel units in the array substrate belong to prior art, and details are omitted here.

Descriptions have already been made with reference to an example in which a light blocking region is the region where a thin film transistor and a metal signal line are located, however, embodiments according to the invention may also be applied to an array substrate of a transflective type and a liquid crystal display having the array substrate. In this case, a pixel for display of a pixel unit includes a transmissive sub-pixel and a reflective sub-pixel, and a light blocking region further includes the region where the reflective sub-pixel is located.

Based on the same inventive concept, according to an embodiment of the invention, there is further provided a liquid crystal display panel, including the above array substrate provided by embodiments of the invention. The principle to solve issues of the liquid crystal display panel is similar to that of a foregoing array substrate, and thus, for implementation of the liquid crystal display panel, reference to implementation of the foregoing array substrate can be made, details being omitted here.

Based on the same inventive concept, according to an embodiment of the invention, there is further provided a display device, including the above liquid crystal display panel provided by embodiments of the invention. The display device may be a cell phone, a tablet computer, a television, a display, a notebook computer, a digital photo frame, a navigator or any other product or component having a display function. As regards other essential constituent parts of the display device that are all provided as should be understood by those skilled in the art, details are omitted here, and they shall not be construed as limitative of the present invention. For implementation of the display device, reference to the above embodiment of liquid crystal display panel can be made, and repetitions are omitted here.

With respect to an array substrate, a liquid crystal display panel and a display device provided by embodiments of the invention, the array substrate includes a base substrate, a plurality of pixel units disposed on the base substrate and arranged in the form of a matrix, and a drive module for providing each pixel unit with a display signal. Each of the pixel units is divided into a transmissive region and a light blocking region. It further includes a photovoltaic battery component electrically connected to the drive module, and the photovoltaic battery component is disposed between the base substrate and the pixel units, or disposed on a side of the base substrate facing away from the pixel units. The photovoltaic battery component includes a plurality of photovoltaic sub-batteries, each of which includes a first transparent electrode, a photovoltaic thin film and a second transparent electrode laminated in sequence. The orthographic projection of the photovoltaic thin film on the base substrate lies within the light blocking region. With respect to the above array substrate provided by embodiments of the invention, due to provision of the photovoltaic battery component electrically connected to the drive module, the array substrate can use the photovoltaic battery component to transform the optical energy of the light blocking region into electrical energy, and to output the electrical energy to the drive module for its use. Thus, the optical energy of the light blocking region can be utilized effectively, and utilization rate of the optical energy of the array substrate is raised. Furthermore, the orthographic projection of the opaque photovoltaic thin film in the photovoltaic battery component on the base substrate lies within the light blocking region, and therefore, aperture ratio of each pixel unit in the array substrate will not be affected.

Descriptions made above are merely exemplary embodiments of the invention, and are not used to limit the protection scope of the invention. The protection scope of the invention is determined by attached claims.

This application claims the benefit of priority from Chinese patent application No. 201410010209.6, filed on Jan. 9, 2014, the disclosure of which is incorporated herein in its entirety by reference as a part of the present application.

What is claimed is:

1. An array substrate, comprising a base substrate, a plurality of pixel units disposed on the base substrate and arranged in a form of matrix, and a drive module providing each of the pixel units with a display signal; each of the pixel units being divided into a transmissive region and a light blocking region, wherein, the array substrate further includes:
a photovoltaic battery component electrically connected to the drive module, which is disposed between the base substrate and the pixel units, or disposed on a side of the base substrate facing away from the pixel units;
the photovoltaic battery component includes a plurality of photovoltaic sub-batteries, each of which includes a first transparent electrode, a photovoltaic thin film and a second transparent electrode laminated in sequence; wherein,
an orthographic projection of the photovoltaic thin film on the base substrate lies within the light blocking region.

2. The array substrate according to claim 1, further comprising:
a metal reflective layer located between the pixel units and the photovoltaic battery component;
the orthographic projection of the photovoltaic thin film on the base substrate falls within an orthographic projection of the metal reflective layer on the base substrate, and the orthographic projection of the metal reflective layer on the base substrate lies within the light blocking region.

3. The array substrate according to claim 2, wherein, the pixel units and the photovoltaic battery component are located on a same side of the base substrate, and the metal reflective layer is located directly on the second transparent electrode, and patterns of the second transparent electrode and the metal reflective layer are coincide.

4. The array substrate according to claim 2, the pixel units and the photovoltaic battery component are located on two sides of the base substrate, respectively, the metal reflective layer is located directly on the first transparent electrode, and patterns of the first transparent electrode and the metal reflective layer are coincide.

5. The array substrate according to claim 2, further comprising a voltage-stabilizing and current-stabilizing module, through which the photovoltaic battery component is electrically connected to the drive module.

6. The array substrate according to claim 2, wherein, a plurality of the photovoltaic sub-batteries are connected in series or in parallel to each other.

7. The array substrate according to claim 2, wherein, the photovoltaic thin film includes an amorphous silicon thin film and a microcrystalline silicon thin film which are laminated.

8. The array substrate according to claim 2, wherein, the light blocking region is a region where a thin film transistor and a metal signal line of the array substrate are located.

9. The array substrate according to claim 1, wherein, the pixel units and the photovoltaic battery component are located on a same side of the base substrate, and the array substrate further includes a planarizing layer located between the photovoltaic battery component and the pixel units.

10. The array substrate according to claim 1, further comprising a voltage-stabilizing and current-stabilizing module, through which the photovoltaic battery component is electrically connected to the drive module.

11. The array substrate according to claim 1, wherein, a plurality of the photovoltaic sub-batteries are connected in series or in parallel to each other.

12. The array substrate according to claim 1, wherein, the photovoltaic thin film includes an amorphous silicon thin film and a microcrystalline silicon thin film which are laminated.

13. The array substrate according to claim 1, wherein, the light blocking region is a region where a thin film transistor and a metal signal line of the array substrate are located.

14. The array substrate according to claim 13, wherein, a pixel for display of the pixel unit includes a transmissive sub-pixel and a reflective sub-pixel, and the light blocking region further includes a region where the reflective sub-pixel is located.

15. A liquid crystal display panel, comprising the array substrate according to claim 1.

16. A display device, comprising the liquid crystal display panel according to claim 15.

17. The liquid crystal display panel according to claim 15, further comprising:
    a metal reflective layer located between the pixel units and the photovoltaic battery component;
    the orthographic projection of the photovoltaic thin film on the base substrate falls within an orthographic projection of the metal reflective layer on the base substrate, and the orthographic projection of the metal reflective layer on the base substrate lies within the light blocking region.

18. The liquid crystal display panel according to claim 17, wherein, the pixel units and the photovoltaic battery component are located on a same side of the base substrate, and the metal reflective layer is located directly on the second transparent electrode, and patterns of the second transparent electrode and the metal reflective layer are coincide.

19. The liquid crystal display panel according to claim 17, the pixel units and the photovoltaic battery component are located on two sides of the base substrate, respectively, the metal reflective layer is located directly on the first transparent electrode, and patterns of the first transparent electrode and the metal reflective layer are coincide.

20. The liquid crystal display panel according to claim 15, wherein, the pixel units and the photovoltaic battery component are located on a same side of the base substrate, and the array substrate further includes a planarizing layer located between the photovoltaic battery component and the pixel units.

\* \* \* \* \*